United States Patent
Brown et al.

(10) Patent No.: US 8,705,608 B2
(45) Date of Patent: Apr. 22, 2014

(54) NOISE DISCRIMINATOR FOR ENHANCED NOISE DETECTION IN A PASSIVE OPTICAL NETWORK BURST MODE RECEIVER

(75) Inventors: George W. Brown, San Jose, CA (US); Thomas S. Wong, San Jose, CA (US); Bernd Neumann, Müllrose (DE)

(73) Assignee: Micrel, Inc., San Jose, CA (US)

(*) Notice: Subject to any disclaimer, the term of this patent is extended or adjusted under 35 U.S.C. 154(b) by 91 days.

(21) Appl. No.: 13/587,662

(22) Filed: Aug. 16, 2012

(65) Prior Publication Data
US 2013/0279903 A1  Oct. 24, 2013

Related U.S. Application Data

(60) Provisional application No. 61/637,235, filed on Apr. 23, 2012.

(51) Int. Cl.
*H03K 5/19* (2006.01)
*H03K 7/00* (2006.01)

(52) U.S. Cl.
CPC ... *H03K 5/19* (2013.01); *H03K 7/00* (2013.01)
USPC .......................................................... 375/239

(58) Field of Classification Search
CPC .................................. H03K 5/19; H03K 7/00
See application file for complete search history.

(56) References Cited

U.S. PATENT DOCUMENTS

| | | | |
|---|---|---|---|
| 7,746,150 B2 | 6/2010 | Wong et al. | |
| 8,374,573 B1 * | 2/2013 | Potter, Sr. | 455/345 |
| 2011/0006824 A1 * | 1/2011 | Kang et al. | 327/175 |
| 2011/0158033 A1 * | 6/2011 | Park et al. | 365/233.18 |

* cited by examiner

*Primary Examiner* — Erin File
(74) *Attorney, Agent, or Firm* — Van Pelt, Yi & James LLP

(57) ABSTRACT

A noise discriminator circuit and a noise discrimination method in a burst mode receiver is configured to determine the validity of an incoming burst signal by analyzing the timing of the signal edges of incoming signal to look for a time duration conforming to the preamble data bits of a valid burst signal. In one embodiment, the noise discriminator circuit and method analyze the time duration between signal edges of the same pulse of an incoming signal. In another embodiment, the noise discriminator circuit and method analyze the time duration between a first set of pulses of an incoming signal and the time duration between signal edges of a second set of pulses of the incoming signal. When the time durations are within a given time range relating to a predetermined timing separation of a valid burst signal, the incoming signal is validated as a valid burst signal.

22 Claims, 13 Drawing Sheets

NOISE DISCRIMINATOR FOR ENHANCED NOISE DETECTION IN A PASSIVE OPTICAL NETWORK BURST MODE RECEIVER

CROSS-REFERENCE TO RELATED APPLICATIONS

This application claims the benefit of U.S. Provisional Patent Application Ser. No. 61/637,235, filed on Apr. 23, 2012, which application is incorporated herein by reference in its entirety.

This application is related to currently filed and commonly assigned U.S. patent application Ser. No. 13/587,639, entitled "Noise Discriminator for Passive Optical Network Burst Mode Receiver," having the same inventors hereof, which application is incorporation herein by reference in its entirety.

FIELD OF THE INVENTION

The invention relates to burst mode receivers used in a passive optical network (PON) optical line terminal (OLT) and, in particular, to a burst mode receiver including a noise discriminator for detecting valid input data.

DESCRIPTION OF THE RELATED ART

A passive optical network (PON) is a point-to-multipoint, fiber to the premises optical distribution network architecture in which unpowered optical splitters are used to enable a single optical fiber to serve multiple premises, typically 16-128. A PON consists of an optical line terminal (OLT) at the service provider's central office and a number of optical network terminals (ONT) or optical network units (ONUs) near end users. A PON reduces the amount of fiber and central office equipment required compared with point to point architectures.

In a PON, downstream signals are broadcasted to all premises sharing multiple fibers. Encryption is used to prevent eavesdropping. Upstream signals are combined using a multiple access protocol, usually time division multiple access (TDMA). The OLT may range the ONUs in order to provide time slot assignments for upstream communication.

SUMMARY OF THE INVENTION

According to one embodiment of the present invention, a method in a burst mode receiver to determine the validity of an incoming burst signal includes receiving consecutive pulses of an incoming signal; determining if a first time duration between a signal edge of a first pulse and a signal edge of a second pulse is within a first time range of a predetermined timing separation of a valid burst signal, the first pulse and the second pulse being consecutive pulses; if the first time duration is within the first time range, determining if a second time duration between the signal edge of the second pulse and a signal edge of a third pulse is within the first time range, the second pulse and the third pulse being consecutive pulses; if the second time duration is within the first time range, asserting a signal indicative of a valid burst signal; and if the first time duration is not within the first time range or the second time duration is not within the first time range, deasserting the signal indicative of a valid burst.

According to another aspect of the present invention, a limiting amplifier for a burst mode receiver including an amplifier configured to receive and amplify an input signal representative of an incoming burst signal; a buffer configured to receive the amplified input signal and to generate an output signal; a noise discriminator circuit configured to receive the amplified input signal and to assert a valid output signal when a first time duration between a signal edge of a first pulse and a signal edge of a second pulse is within a first time range of a predetermined timing separation of a valid burst signal, the first pulse and the second pulse being consecutive pulses, and when a second time duration between the signal edge of the second pulse and a signal edge of a third pulse is within the first time range, the second pulse and the third pulse being consecutive pulses; and a signal detect generator circuit configured to assert a signal detect signal when the valid output signal is asserted.

The present invention is better understood upon consideration of the detailed description below and the accompanying drawings.

BRIEF DESCRIPTION OF THE DRAWINGS

FIG. 11, which includes

FIG. 12, which includes

DETAILED DESCRIPTION OF THE PREFERRED EMBODIMENTS

In accordance with the principles of the present invention, a burst mode receiver for use in an optical line terminal (OLT) of a passive optical network (PON) includes a noise discriminator circuit to determine the validity of the incoming data signal so as to minimize false triggers of the signal detect (SD) signal. The noise discriminator circuit performs one or more timing measurements on the incoming data signal to detect for a predetermined time duration indicative of a PON preamble sequence. In this manner, the noise discriminator circuit verifies that the incoming data signal is a bona fide PON burst signal preamble consisting of the predetermined preamble data pattern and not random noise. In this manner, the noise discriminator circuit improves the robustness of the signal detection of the burst mode receiver.

Figure 1:
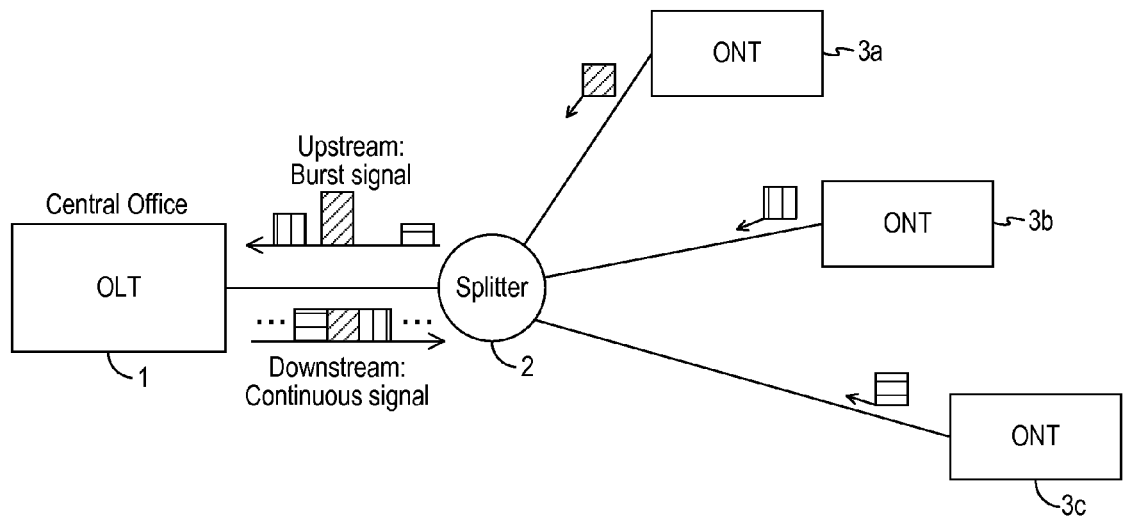
FIG. 1 is a schematic diagram of a passive optical network including an optical line terminal communicating with multiple optical network terminals over an optical fiber network.

FIG. 1 is a schematic diagram of a passive optical network including an optical line terminal communicating with multiple optical network terminals over an optical fiber network. Referring to FIG. 1, a passive optical network (PON) includes an optical line terminal (OLT) 1 used in the central office environment to communicate with a variety of optical network terminals (ONTs) 3a-3c, typically through a power splitter 2. The optical network terminals (ONTs) may sometimes be referred to as optical network units (ONUs). While the downstream data signal sent from the OLT 1 to the ONTs 3a-c is a continuous signal, the upstream data signal sent from each ONT 3a-c to the OLT1 is a burst signal. Burst signals have no signal between data segments. The upstream burst signals are combined using a multiple access protocol, such as time division multiple access (TDMA). When TDMA is used, each ONT in the PON transmits its payload as a burst of data in its allotted time slot and remains silent until it is its turn to transmit again. As a result, the OLT 1 at the central office receives upstream data signals in the form of burst signals that are separated by different time intervals.

Furthermore, the ONTs are typically located at different distances from the central office OLT and sometimes go through differing numbers of power splitters before reaching the central office. When the distance between the ONTs and the central office OLT varies and when the upstream signals pass through different numbers of power splitters, the signal strength of the burst signals from the ONTs is affected. Some of the burst signals may be strong while other burst signals may be weak. Therefore, the upstream data signals arriving at the central office OLT become a series of burst signals with different timing intervals and each of which can differ in optical power by as much as +/−30 dBm.

The OLT 1 uses a burst mode receiver to receive the upstream data signals from the ONTs. The burst mode receiver at the OLT has to receive and normalize optical burst signals having different signal strength and timing and to convert the input optical signals into electrical signals of fixed intensity and timing. In particular, the burst mode receiver must have the gain and ability to normalize the incoming data stream so that the weakest incoming power level is equal in amplitude to the strongest incoming power level.

Figure 2:
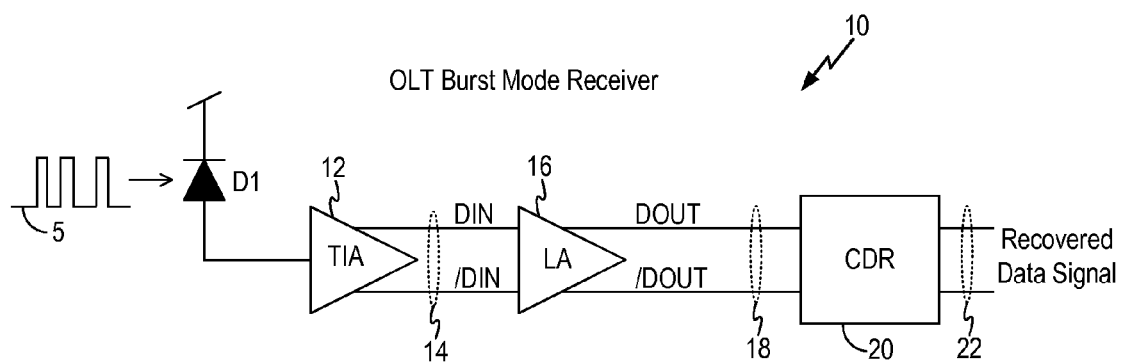
FIG. 2 is a schematic diagram of a burst mode receiver which can be incorporated in an optical line terminal (OLT) of a passive optical network according to embodiments of the present invention.

FIG. 2 is a schematic diagram of a burst mode receiver which can be incorporated in an optical line terminal (OLT) of a passive optical network according to embodiments of the present invention. Referring to FIG. 2, a burst mode receiver 10 for an OLT includes an optical photo sensor, such as a photodiode D1, which converts the incoming optical signal 5 into an electrical signal. The burst mode receiver 10 further includes one or more amplifier stages to convert the electrical signal generated by the photodiode D1, which can be a weak or strong signal, into a fixed-amplitude voltage signal. In the present embodiment, the photodiode D1 generates an electrical current signal and the burst mode receiver 10 includes a transimpedance amplifier (TIA) 12 which amplifies and converts the current signal from the photodiode D1 into a voltage signal (node 14). The burst mode receiver 10 further includes a limiting amplifier (LA) 16 (also referred to as a "post amplifier") to receive the voltage signal on node 14. The limiting amplifier 16 receives a voltage signal which may have weak and strong voltage values and converts the weak and strong voltage values into a fixed-amplitude voltage signal (node 18).

In the present embodiment, the amplifier stages 12 and 16 are configured as differential amplifiers. TIA 12 generates a differential output voltage signal DIN and /DIN on node 14 and limiting amplifier 16 generates a differential output voltage signal DOUT and /DOUT having fixed amplitude on node 18. The burst mode receiver may further include a clock and data recovery circuit 20 to extract timing clock information from the fixed-amplitude voltage signal DOUT and /DOUT. CDR circuit 20 reshapes the DOUT signal waveform using the extracted clock signal to generate the recovered data signal (node 22) indicative of the incoming signal 5.

In order to be able to receive the weakest signals coming from the various ONTs on the passive optical network, most, if not all, burst mode receivers make use of avalanche photodiodes (APD) as the optical photo sensors. It is well know that APD sensors have much higher gain than the more common PIN (P type-Intrinsic-N type) photo sensors and also create a lot more thermal noise. The APD sensor works on the principle of amplifying hole-electron carriers that are generated by optical photon energy by accelerating them under a relatively high electric field to enough energy to generate additional hole-electron carriers though collisions with the lightly doped silicon lattice. This in turn frees additional carriers that are also accelerated under this electric field until an "avalanche effect" results to generate many times the number of carriers that were originally generated by the photon that initialized the avalanche. The APD photo sensors work well as long as the only carriers generated are from the incoming optical data stream which is sent as ones and zeros represented by optical levels.

However, APD photo sensors also have random hole-electron carriers that are generated by background thermal energy which are amplified as well. These thermally generated carriers act as noise because these small spikes of noise are entirely random and are not necessarily synchronous with the incoming data stream except that they do tend to sometimes ride on the crests of the one's signal pattern in the data stream. Since the burst mode receiver must be able to detect and act on signals with the smallest signal level very quickly, such as on the first few preamble bits of the optical data stream, this random noise can trigger the very sensitive signal detection circuitry of the receiver to react so as to create a false trigger that both enables the receiver and falsely asserts a signal-detect (SD) signal and/or falsely deasserts a loss-of-signal (LOS) signal. False triggering of the signal-detect signal or false deassertion of the loss-of-signal signal is undesirable.

Furthermore, if the OLT receives a noise glitch and assumes it is the first bit of an incoming burst, the OLT could falsely identify the specific ONT being polled is a "Rogue ONT", that is, the ONT is responding out of turn and is either unreliable or defective. Rogue ONTs are known to be very difficult to trouble shoot and can hang up the PON system until it is isolated and masked from the system. It is therefore very important to eliminate and/or minimize the incidence of false signal detect by the OLT burst mode receiver in the central office environment.

In embodiments of the present invention, a burst mode receiver for use in an OLT in a PON implements signal level detection and signal timing detection to differentiate between a valid incoming PON data stream that may be a weak signal from a remote ONT and random thermal noise. Because the burst mode receiver may be receiving bursts of data from different remote locations on the optical distribution network from a large number of ONTs which are going through different numbers of optical power splitters, the burst mode receiver may receive data of different amplitudes and must be capable of quickly determining whether the new burst of data is a valid burst signal preamble, what the relative power level is, and prepare the receiver to receive the incoming data payload.

Figure 3A:
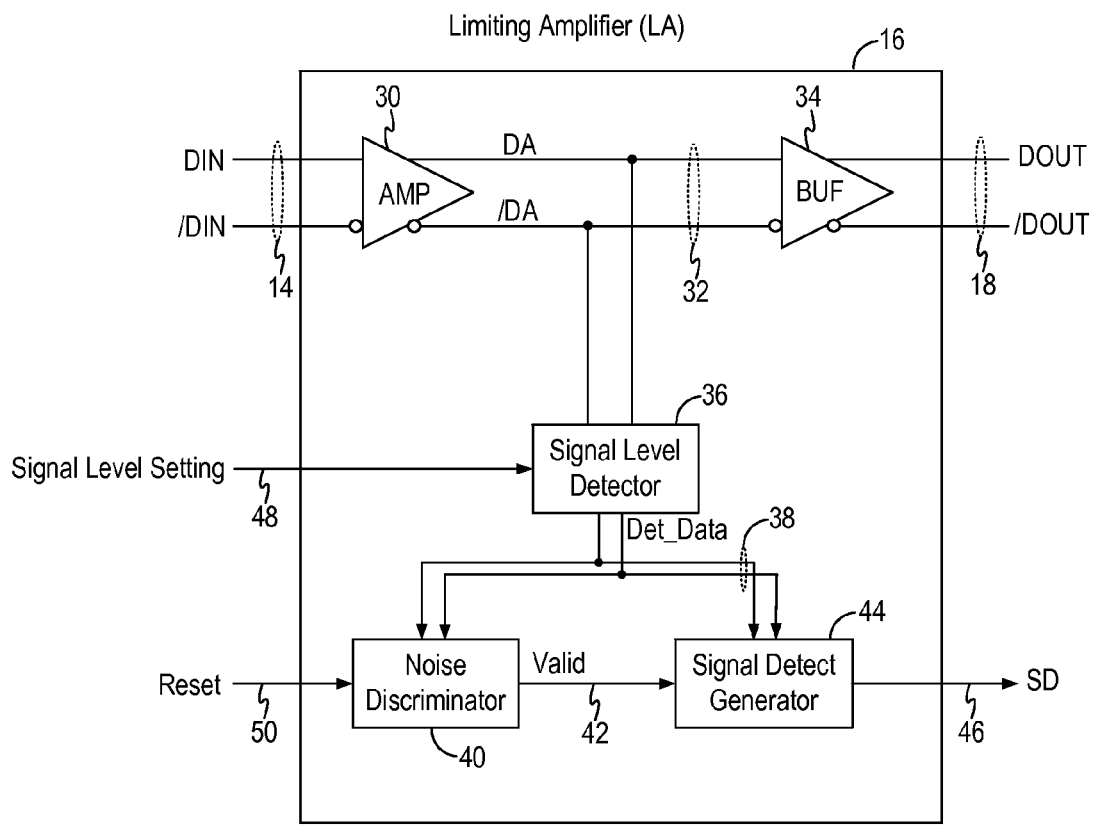
FIG. 3A is a schematic diagram of a limiting amplifier incorporating a signal level detector circuit and a noise discriminator circuit according to one embodiment of the present invention.

In embodiments of the present invention, the signal level detection and signal timing detection functions are incorporated in the limiting amplifier 16 of the burst mode receiver 10. In some embodiment, the limiting amplifier 16 of the burst mode receiver 10 incorporates a signal level detector circuit and a noise discriminator circuit to validate an incoming data signal. FIG. 3A is a schematic diagram of a limiting amplifier incorporating a signal level detector circuit and a noise discriminator circuit according to one embodiment of the present invention. Referring to FIG. 3A, a limiting amplifier 16 (also referred to as a post amplifier) receives an input signal DIN and /DIN being a voltage signal indicative of the optical signal detected by the photodiode and having weak and strong or uneven-amplitude voltage levels. The limiting amplifier 16 includes an amplifier 30 receiving the uneven-amplitude voltage signal DIN and /DIN and generating an amplified signal DA and /DA (node 32). The limiting amplifier 16 further includes a buffer 34 to buffer the amplified signal DA and /DA (node 32) to generate a fixed-amplitude output voltage signal DOUT and /DOUT (node 18). In the present embodiment, both amplifier 30 and buffer 34 are differential circuits. In other embodiments, single-ended amplifier and buffer may be used.

Limiting amplifier 16 includes a signal level detector circuit 36 configured to detect the voltage level of the incoming signal received by the burst mode receiver. In particular, the signal level detector circuit 36 compares the amplified signal DA and /DA (node 32) to a signal threshold. Signal level detector circuit 36 operates to validate the incoming signal based on the signal level. The incoming signal is determined to be a possible burst signal containing data only if the amplitude of the signal has a sufficiently high level that is greater than the signal threshold. In one embodiment, if the amplified signal DA is greater than the signal threshold, then the signal detector circuit 36 determines that the amplified signal may contain valid data and allows the signal to pass through as a detected data signal Det_Data (node 38). In other words, the detected data signal Det_Data is a gated data signal which is asserted when the amplified signal DA and /DA is above the signal threshold. When the amplified signal DA and /DA is below the signal threshold, the detected data signal Det_Data is not asserted. In one embodiment, the signal threshold is set by a signal level setting input signal (node 48) so that the signal threshold can be set to a desired level.

The detected data signal Det_Data is coupled to a noise discriminator circuit 40 and a signal-detect (SD) generator circuit 44. The detected data signal Det_Data is coupled to the noise discriminator circuit 40 to validate the incoming signal based on the signal timing. The noise discriminator circuit 40 performs one or more timing measurements on the detected data signal Det_Data to detect for the predetermined timing relationship that is associated with a PON preamble bit stream. In some embodiments, the noise discriminator circuit 40 measures the time duration between the signal edges to determine if the time duration meets the timing separation of signal edges of a PON preamble bit stream. The PON preamble bit stream has a fixed data pattern and timing edges of the fixed data pattern are therefore known and predetermined. When the noise discriminator circuit 40 detects a correct timing duration in the detected data signal Det_Data, the noise discriminator circuit 40 asserts a Valid signal (node 42) indicating detection of a valid burst preamble signal. The Valid signal is coupled to the signal detect generator 44. In some embodiments, the noise discriminator circuit 40 receives a reset signal 50 to reset the internal states of the noise discriminator circuit and to reset the Valid signal to a deassert level.

The signal detector generator 44 is configured to assert the signal-detect (SD) signal or deassert the loss-of-signal (LOS) signal (node 46) when both the detected data signal Det_Data is asserted and the Valid signal is asserted. In this manner, the limiting amplifier 16 triggers the signal-detect SD signal only when the incoming signal (DIN) has a sufficiently high signal level and the incoming signal has the correct timing sequence to be a PON burst preamble. In this manner, the assertion of the SD signal is robust and reliable and false triggering of the SD signal is prevented.

Figure 3B:
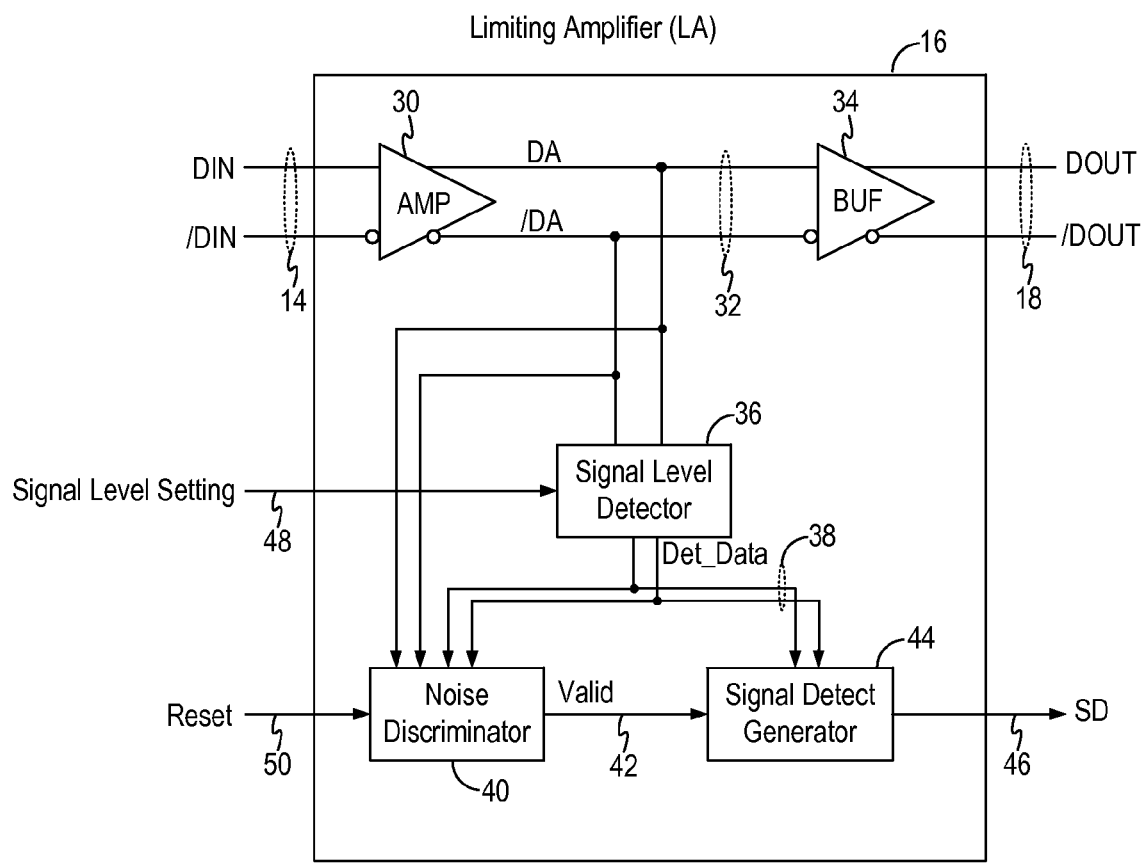
FIG. 3B is a schematic diagram of a limiting amplifier incorporating a signal level detector circuit and a noise discriminator circuit according to an alternate embodiment of the present invention.

In alternate embodiments of the present invention, the noise discriminator circuit 40 may operate on the amplified signal DA and /DA directly, as shown in FIG. 3B. In that case, the noise discriminator circuit 40 receives the amplified signal DA and /DA to perform timing measurements. In some embodiments, the noise discriminator circuit 40 is gated by the detected data signal Det_Data so that the noise discriminator circuit 40 is activated only when the detected data signal Det_Data is asserted. For example, in one embodiment, the detected data signal Det_Data is used to control an internal reset signal to keep the noise discriminator circuit 40 in a reset state until the detected data signal Det_Data is asserted.

Figure 4:
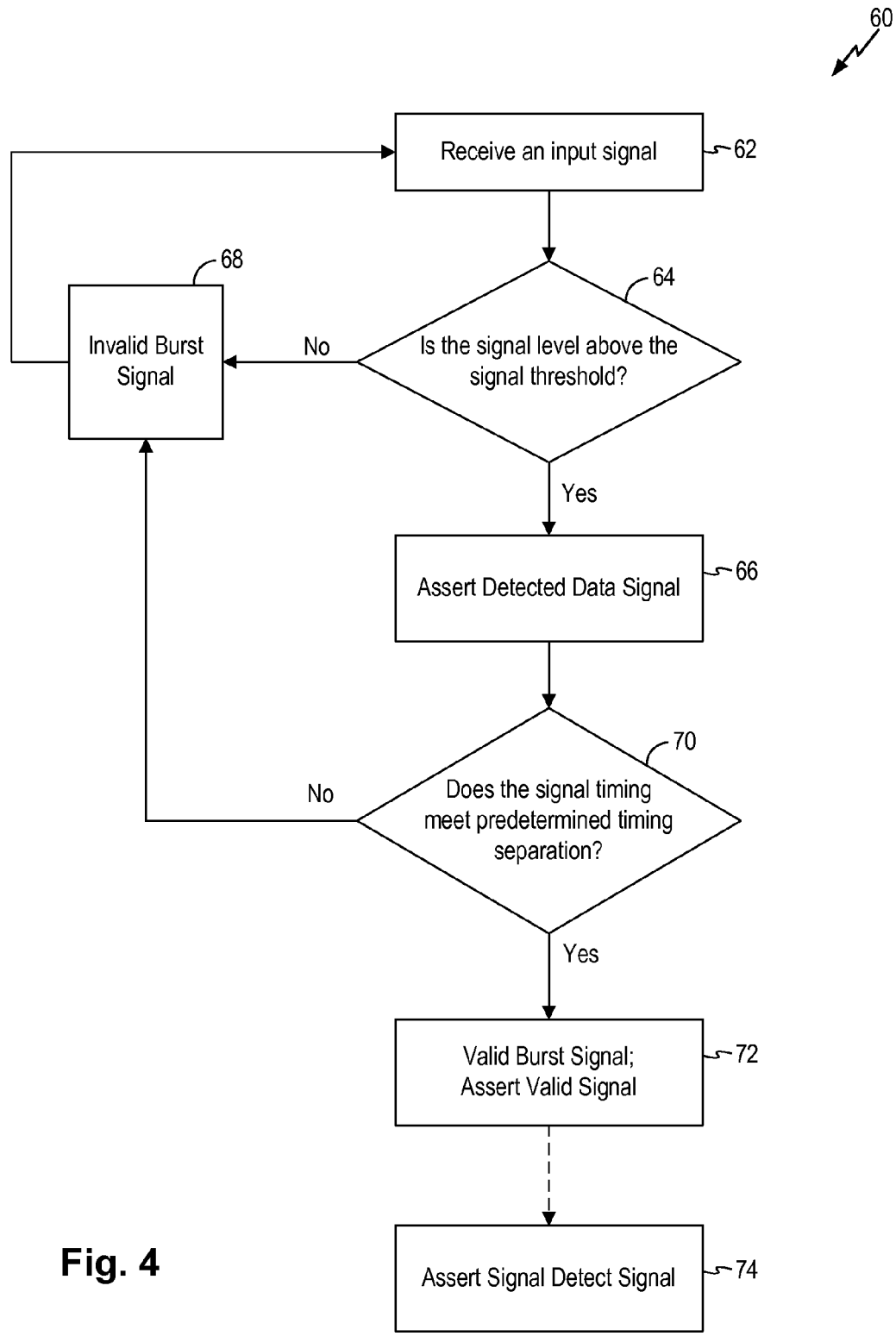
FIG. 4 is a flow chart illustrating the operation of the limiting amplifier of FIGS. 3A and 3B for validating the incoming signal according to one embodiment of the present invention.

FIG. 4 is a flow chart illustrating the operation of the limiting amplifier of FIGS. 3A and 3B for validating the incoming signal according to one embodiment of the present invention. Referring to FIG. 4, a burst signal validation method 60 started by receiving an input signal where the input signal is a voltage signal representative of an input optical signal carrying burst signals (step 62). The input signal may be amplified. In one embodiment, the input signal is the amplified signal DA of the limiting amplifier of FIG. 3.

The burst signal validation method 60 determines if the input signal has a signal level that is above the signal threshold (step 64). If the signal level is below the signal threshold, then the input signal is not a valid burst signal (step 68) and method 60 returns to step 62. If the signal level is above the signal threshold, method 60 proceeds to assert a detected data signal (step 66). Method 60 then proceeds to determine if the input signal has a signal timing that meets the predetermined timing separation of a PON burst signal preamble (step 70). For instance, the method may determine if the time duration between signal edges of the input signal is within a range of the predetermined timing separation of the PON burst signal preamble. If the input signal does not have a signal timing that matches the predetermined PON preamble timing separation, then the input signal is not a valid burst signal (step 68) and method 60 returns to step 62. However, if the input signal has a signal timing that meets the predetermined PON preamble timing separation, then method 60 determines that the input signal is a valid burst signal and asserts a Valid signal (step 72). In some embodiments, when the detected data signal and the Valid signal are both asserted, method 60 asserts the signal-detect (SD) signal (step 74) or deasserts a loss-of-signal (LOS) signal.

The burst signal validation method 60 operates to validate an incoming optical signal as a valid burst signal by measuring the signal amplitude and the signal timing. In the method shown in FIG. 4, the signal level and signal timing measurement steps are performed in series. The flow chart in FIG. 4 is illustrative only and is not intended to be limiting. In other embodiments, the signal level measurement step can be performed before, after, or concurrent with the signal timing measurement step. The exact order of performing the measurements is not critical to the practice of the present invention. The burst signal validation method 60 operates by validating the incoming optical signal using two conditions: signal level and signal timing. In some embodiments, it is more advantageous to perform the signal timing measurement step after the signal level measurement step so that the signal timing measurement is only performed when the input signal has sufficient signal amplitude to be considered a possible valid burst signal.

Furthermore, in other embodiments, a limiting amplifier of a burst mode receiver may be implemented using only the noise discriminator circuit and omitting the signal level detector. Similarly, the burst signal validation method may be implemented using only signal timing measurements to differentiate between a valid incoming PON data stream that may be a weak signal from a remote ONT and random thermal noise. While the use of both signal level detection and signal timing detection is useful in increasing the confidence level of the valid burst signal determination, the noise discriminator circuit and method may be employed alone to determine burst signal validity.

The operation of the noise discriminator circuit and noise discrimination method to validate an incoming signal as a valid burst signal based on signal timing will now be described in more details.

As described above, in the PON architecture, the signal sent from an ONT/ONU to the OLT (at the central office) is a burst signal. The OLT receives no signal at all between consecutive burst signals. The PON burst signal is led by a preamble consisting of 4 to 6 bytes of a specific data pattern. In particular, each byte of the preamble is formed by a data pattern consisting of 8 bits of alternating one's and zero's, that is, "10101010." The preamble bytes allow the burst mode receiver in the OLT to determine the average power level of the incoming burst signal and prepare the receiver to receive the packet of data containing the payload that follows the preamble bit stream.

The burst mode receiver needs to be capable of reacting very quickly to an incoming burst signal, normally on the first few bits of the preamble. Therefore, the receiver is typically constructed using very sensitive circuitry capable of detecting very short pulses of data in the preamble. However, the sensitive circuitry used in the receiver renders the burst mode receiver very sensitive to random single event such as noise spikes that are very short in duration that may occur during the waiting period before consecutive burst signals. As a result, the receiver may get turned on erroneously by reacting noise signals.

In accordance with embodiments of the present invention, the burst mode receiver uses the noise discriminator circuit to prevent the receiver from reacting to random noise events and yet preserves the receiver's ability to quickly react to a valid incoming preamble bit stream. In some embodiments, the noise discriminator circuit detects an incoming signal and validates the incoming signal as a valid burst signal by analyzing the timing of the incoming signal for the leading bits of the preamble data pattern. More specifically, the noise discriminator circuit takes advantage of the predetermined and precisely timed preamble data bits to very quickly validate the incoming signal as being a true preamble bit stream that precedes the data payload of a burst signal rather than random noise. In some embodiments, the noise discriminator circuit generates a determination as to whether the incoming data is valid during the early preamble bit sequence that precedes the payload information.

In this manner, the burst mode receiver is able to ascertain that the incoming signal is valid during the early preamble bits so that the receiver has sufficient time to sample the preamble long enough to prepare the receiver to receive the packet of payload data that follows the preamble. For instance, once a valid burst signal is determined, the receiver may then sample the preamble for a sufficiently long time so as to center data thresholds and to prepare the receiver circuitry to receive the balance of the incoming burst signal containing the data payload.

With the use of the noise discriminator circuit, the burst mode receiver is prevented from falsely triggering a signal-detect (SD) signal or falsely deasserting a loss-of-signal (LOS) signal in the event the incoming data is merely random noise. More importantly, the noise discriminator circuit can discern valid preamble information very quickly so that the receiver has sufficient time to prepare to receive the critical payload information that follows.

Figure 5:
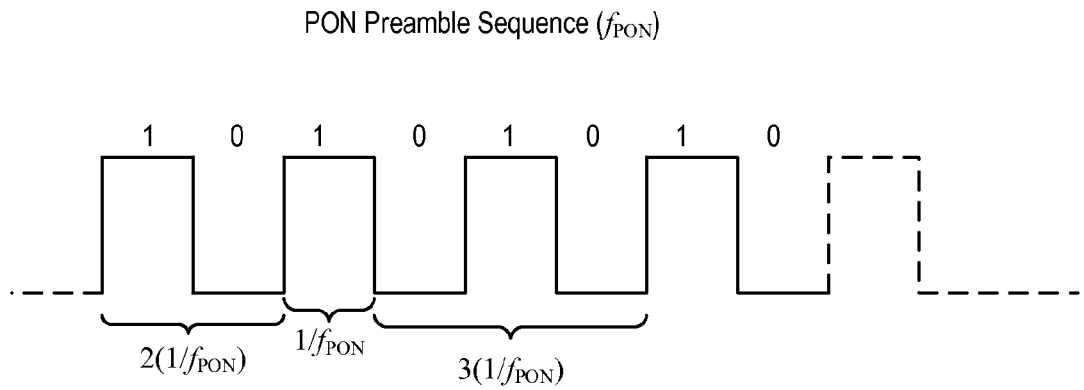
FIG. 5 is a signal waveform diagram illustrating the PON preamble data pattern and the operation of the noise discriminator circuit according to embodiments of the present invention.

FIG. 5 is a signal waveform diagram illustrating the PON preamble data pattern and the operation of the noise discriminator circuit according to embodiments of the present invention. Referring to FIG. 5, a PON preamble data pattern includes 8 bits of alternating one's and zero's, that is, "10101010." When the data rate of the PON is given as $f_{PON}$, the period or time duration of each data bit is $1/f_{PON}$. With the alternating one's and zero's data pattern, there is also a predetermined and precisely timed timing separation between the signal edges of the preamble data stream. For instance, there is a predetermined and precisely timed pulse width between the rising and falling edges of a single data bit in the data pattern. There is also a predetermined and precisely timed timing duration between the signal edges of different data bits the preamble data stream. For example, the pulse width of a "1" or "0" data bit is the period of the data rate or $1/f_{PON}$. Furthermore, the timing duration between two rising edges or two falling edges of the preamble data stream is twice the period or $2(1/f_{PON})$. The timing duration between a rising edge and the second falling edge that follows is three times the period or $3(1/f_{PON})$. In embodiments of the present invention, the noise discriminator circuit makes use of these known pulse width and timing duration to determine if an incoming signal is indeed a valid PON preamble data stream. In the present description, the term "timing separation" is used to refer to the time difference between signal edges of the incoming signal. The signal edges can be the rising and falling edges of a single data bit in which case the timing separation is the pulse width of a single signal pulse in the incoming signal. The signal edges can also be the rising or falling edges of different data bits in the incoming signal in which case the timing separation is the timing duration of the selected signal edges of signal pulses in the incoming signal.

Figure 6:
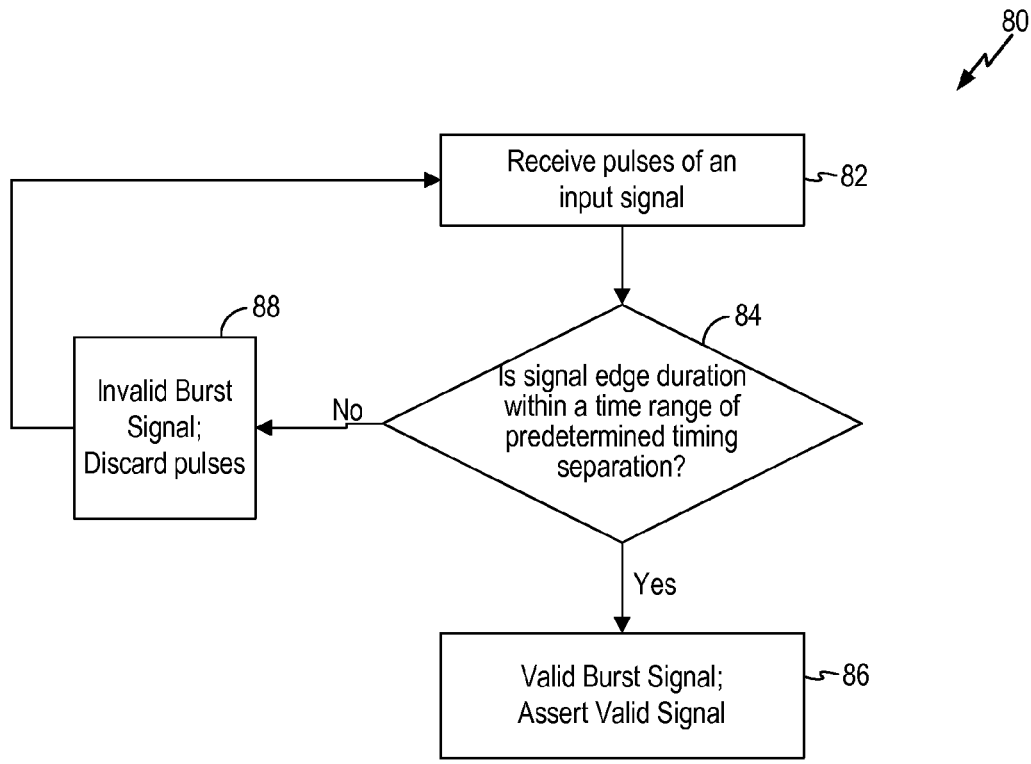
FIG. 6 is a flow chart illustrating the noise discrimination method performed by the noise discriminator circuit according to one embodiment of the present invention.

FIG. 6 is a flow chart illustrating the noise discrimination method performed by the noise discriminator circuit according to one embodiment of the present invention. Referring to FIG. 6, the noise discrimination method 80 receives pulses of an input signal where the input signal is representative of an input optical signal (step 82). The noise discrimination method 80 determines if a given signal timing measured on the input signal is within the range of the predetermined timing separation of a PON preamble data stream (step 84). If the measured signal timing is not within the predetermined timing separation, then the input signal is not a valid burst signal and the signal pulses are discarded (step 88). The method returns to step 82 to receive pulses of the input signal.

On the other hand, if the measured signal timing is within the predetermined timing separation, then the noise discrimination method 80 determines that the input signal is a valid burst signal and the method may assert a Valid signal in response (step 86).

The noise discrimination method may operate on any timing separation in the preamble data pattern. For example, the method may measure the timing separation between the rising and falling edges of a single pulse (the pulse width) or the timing separation between signal edges of consecutive pulses. The method may further measure the timing separation between signal edges of two or more pulses. The method may measure the time duration between rising edges or between falling edges. The method may also measure the time duration between a rising edge and a subsequent falling edge or vice versa. In one embodiment, the noise discrimination method measures the time duration between the rising edges of two consecutive pulses to determine if the time duration is within twice the period of the PON data rate. In other embodiment, the noise discrimination method measures the time duration between the rising edges of a first pulse and a third pulse to determine if the time duration is within four times the period of the PON data rate. In yet another embodiment, the noise discrimination method measures the time duration between the falling edge of a first pulse and the rising edge of a third pulse to determine if the time duration is within three times the period of the PON data rate.

Note that in the present description, the ordinals "first," "second," and "third" as used to identify the pulses of the input signal does not refer to the absolute position of the pulses in the preamble data stream but merely denotes relative position of the pulses. That is, a "first pulse" does not refer to the very first signal pulse of the preamble data stream. The noise discrimination method of the present invention can operate on any of the signal pulses of the preamble data stream. However, there are certain advantages of operating the noise discrimination method on the beginning few data pulses of the preamble data stream to ensure that the validity determination is done quickly and there is sufficient preamble data stream left for the burst mode receiver to perform other critical signal measurement functions, such as optimizing the input threshold, in anticipation of receiving the payload.

The noise discrimination method may be configured to measure time duration between rising edges only or falling edges only or a mix of rising and falling edges. The use of only rising edges or only falling edges is advantageous in terms of simpler implementations. However, the use of a mix of rising and falling edges has the advantages of increasing detection accuracy, as it is highly unlikely that two noise pulses will have timing separation that is half the duty cycle of the preamble data stream.

In the noise discrimination method described above, the method performs one timing measurement to determine if the predetermined timing separation is found. In some situation, using a single timing measurement may give a false positive result as two noise signals may happen to have the predetermined timing separation. In embodiments of the present invention, the noise discrimination method performs two or more timing measurements to determine if the same predetermined timing separation is measured at other locations in the incoming signal. Taking multiple timing measurements increases the confidence level of the noise discrimination method as it is unlikely that random noise will have the repeated timing separation pattern of a PON preamble data sequence. When multiple timing measurements are performed, the likelihood of triggering a validity determination due to noise decreases exponentially.

Figure 7:
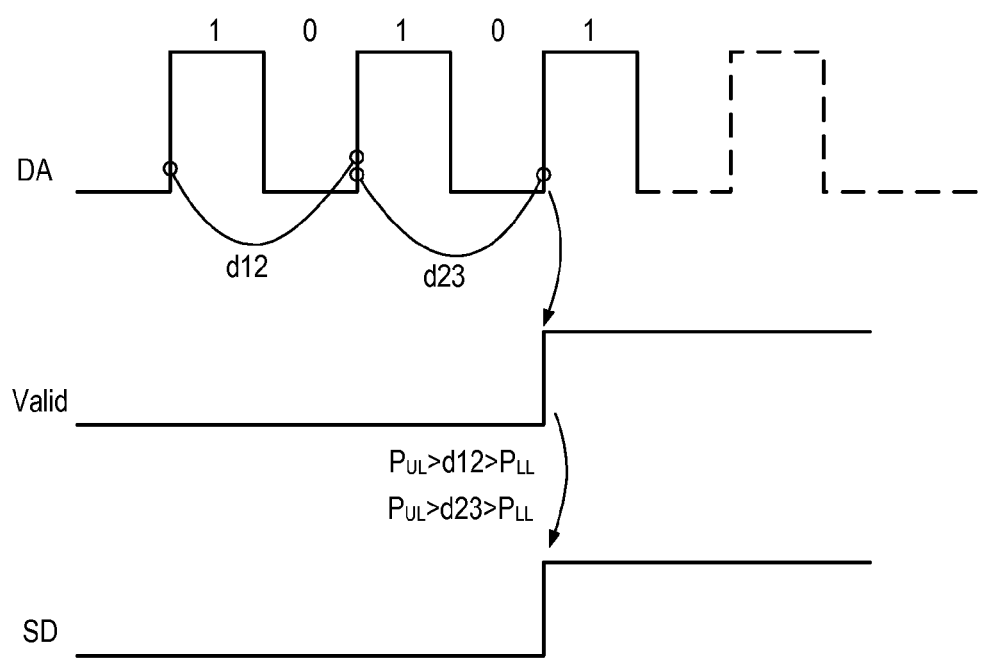
FIG. 7 is a signal waveform diagram illustrating the operation of the noise discrimination method according to a first alternate embodiment of the present invention.
Figure 8:
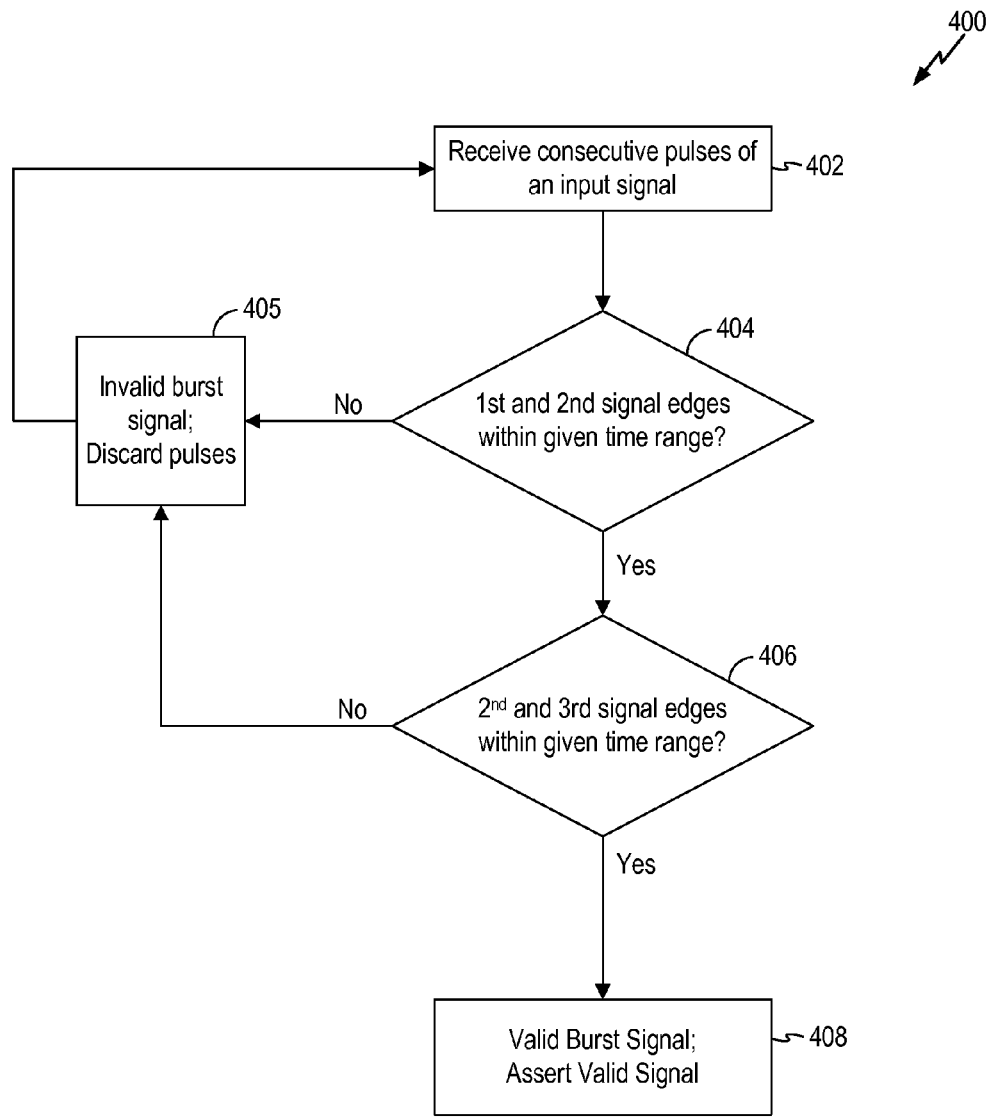
FIG. 8 is a flowchart illustrating the operation of the noise discrimination method of FIG. 7 according to embodiments of the present invention.

In one embodiment of the present invention, the noise discrimination method performs two timing measurements on three consecutive signal pulses to look for the same timing separation of a PON preamble data pattern. FIG. 7 is a signal waveform diagram illustrating the operation of the noise discrimination method according to a first alternate embodiment of the present invention. The operation of the noise discrimination method will be explained with reference to the flowchart in FIG. 8. Referring to FIGS. 7 and 8, in embodiments of the present invention, the noise discrimination method analyzes the timing of the signal edges of the incoming data to look for a data pattern conforming to the preamble bits of a PON burst signal. More specifically, the noise discrimination method analyzes the incoming signal to look for the periodicity of the "10101" data pattern that is characteristic of the preamble of a PON burst signal. In the present embodiment, the noise discrimination method 400 receives consecutive pulses of an input signal representative of an input optical signal (step 402). The noise discrimination method 400 analyzes the timing of the signal edges (rising or falling) of three consecutive pulses to determine if the input signal contains the required timing separation of the "10101" preamble data pattern of a valid burst signal.

In one embodiment, the noise discrimination method validates the incoming signal as a valid burst signal under two conditions. First, the first two signal edges received meet twice the period of the data rate of the PON burst signal. In other words, the noise discrimination method 400 determines if the first two signal edges are within a given time range of each other (step 404) where the given time range is indicative of twice the period of the data rate. Second, the second and third signal edges received also meet twice the period of the data rate of the PON burst signal. In other words, the noise discrimination method determines if the second and third signal edges are within the given time range of each other (step 406). Both of the first and second conditions have to be met for the noise discrimination method 400 to validate the incoming signal as a valid burst signal (step 408). In operation, the noise discrimination method may assert a Valid signal on the third pulse of the incoming signal when the signal edge of the third pulse arrives within the prescribed time period, indicating a valid preamble data pattern. If one of the conditions is not met, the incoming signal is deemed random noise and the noise discrimination method will instruct the receiver to disregard at least the first two incoming signal pulses (step 405) and the noise discrimination method continues to receive signal pulses of incoming signal (step 402).

In the present embodiment, the signal edges being used for measurements are the rising edges of the signal pulses. In other embodiments, the falling edges may also be used. In embodiments of the present invention, two signal edges (both rising or both falling) are considered meeting twice the period of the data rate of the PON burst signal when the two signal edges are within a given time range of each other. In some embodiments, the time range is defined by a lower pulse limit $P_{LL}$ and an upper pulse limit $P_{UL}$. In embodiments of the present invention, the time range can be about +1−10−30% about twice the period of the data rate of the PON burst signal. In the illustration shown in FIG. 7, when the burst mode receiver receives incoming pulses, the noise discrimination method determines if the duration between the first rising edge and the second rising edge "d12" is greater than a lower pulse limit $P_{LL}$ but less than an upper pulse limit $P_{UL}$. That is, the noise discrimination method determines if the condition: $P_{UL}>d12>P_{LL}$ is met. When the first two rising edges meet the timing condition, the noise discrimination method proceeds to determine if the duration between the second rising edge and the third rising edge "d23" is greater than a lower pulse limit $P_{LL}$ but less than an upper pulse limit $P_{UL}$. That is, the noise discriminator circuit determines if the condition: $P_{UL}>d23>P_{LL}$ is met. When both conditions are met, the noise discriminator circuit determines that the incoming signal is a valid preamble bit stream of a burst signal and asserts the Valid signal. In the present embodiment, the Valid signal is asserted on the rising edge of the third pulse meeting the predetermined timing separation. When the Valid signal is asserted, the limiting amplifier of the burst mode receive may assert the signal-detect SD signal or deassert the loss-of-signal LOS signal accordingly to indicate detection of a valid incoming burst signal.

In one embodiment, when the PON is running at 1.25 Gbps data rate, the timing separation between signal edges (rising or falling) of consecutive pulses should be about 1.6 ns. The lower pulse limit $P_{LL}$ is 1.2 ns and the upper pulse limit $P_{UL}$ is 2.1 ns. Thus, the noise discrimination method checks that the signal edges of the two consecutive pulses are within the range of 1.2 ns and 2.1 ns. That is, the second signal edge has to arrive no earlier than 1.2 ns and no later than 2.1 ns from the first signal edge. The noise discrimination method further checks that the signal edge of the third pulse is within the range of 1.2 ns and 2.1 ns from the signal edge of the second pulse. That is, the third signal edge has to arrive no earlier than 1.2 ns and no later than 2.1 ns from the second signal edge. When both conditions are met, the noise discrimination method will assert the Valid signal indicating that the incoming signal is a valid burst signal.

In another embodiment, when the PON is running at 2.5 Gbps data rate, the timing separation between signal edges (rising or falling) of consecutive pulses should be about 0.8 ns. The lower pulse limit $P_{LL}$ is 0.6 ns and the upper pulse limit $P_{UL}$ is 1.0 ns. Thus, the noise discrimination method checks that the signal edges of the two consecutive pulses are within the range of 0.6 ns and 1.0 ns. That is, the second signal edge has to arrive no earlier than 0.6 ns and no later than 1.0 ns from the first signal edge. The noise discrimination method further checks that the signal edge of the third pulse is within the range of 0.6 ns and 1.0 ns from the signal edge of the second pulse. That is, the third signal edge has to arrive no earlier than 0.6 ns and no later than 1.0 ns from the second signal edge. When both conditions are met, the noise discrimination method will assert the Valid signal indicating that the incoming signal is a valid burst signal.

In yet another embodiment, when the PON is running at 10 Gbps data rate, the timing separation between signal edges (rising or falling) of consecutive pulses should be about 0.2 ns. The lower pulse limit $P_{LL}$ can be set to 0.1 ns and the upper pulse limit $P_{UL}$ is 0.3 ns. The lower pulse limit $P_{LL}$ and the upper pulse limit $P_{UL}$ described above for the various PON data rates are illustrative only and are not intended to be limiting. Different values of the lower pulse limit $P_{LL}$ and the upper pulse limit $P_{UL}$ can be used to define a suitable time range to detect for the desired timing separation in the preamble bit stream.

Once the incoming signal is verified to be authentic, i.e., a valid preamble bit string, the amplifier in the receiver is enabled and the incoming data stream is allowed to pass through uninhibited. In one embodiment, the burst mode receiver, upon validation of the incoming data stream, is configured to react quickly and is capable of differentiating a small signal from a large signal in the PON optical distribution network (ODN) environment. This fast signal detect allows the receiver to turn on quickly when there is valid incoming data so as to allow enough time for the receiver to adapt during the preamble period of the burst signal.

Figure 9:
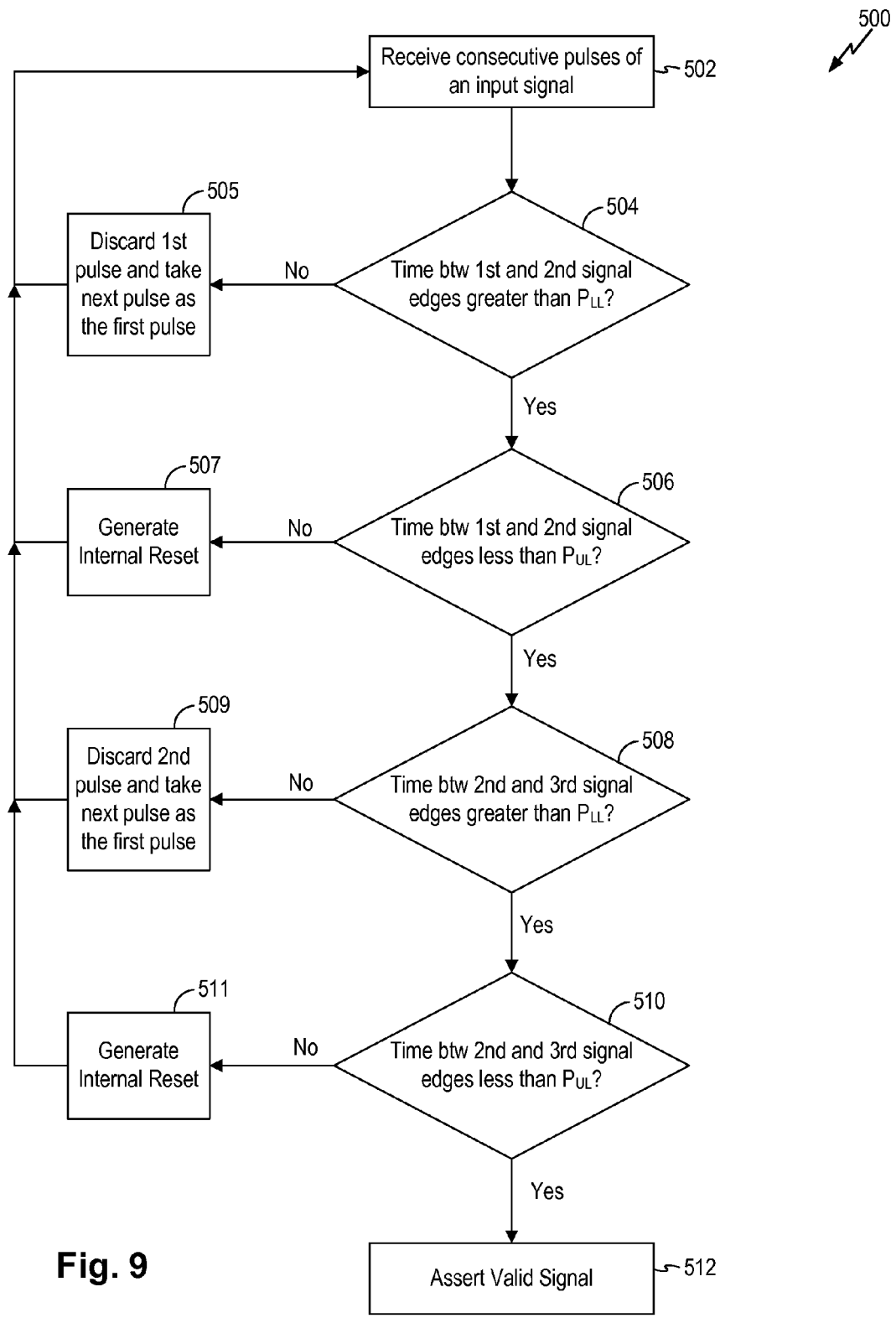
FIG. 9 is a flowchart illustrating the operation of the noise discrimination method according to an alternate embodiment of the present invention.

FIG. 9 is a flowchart illustrating the operation of the noise discrimination method according to an alternate embodiment of the present invention. Referring to FIG. 9, a burst mode receiver noise discrimination method 500 starts by receiving consecutive pulses of an input signal representative of an input optical signal (step 502). Method 500 then determine if the time during between the first and second signal edges of the incoming pulses is greater than the lower pulse limit $P_{LL}$ (step 504). If the time duration between the first two signal edges is shorter than the lower pulse limit $P_{LL}$, then the first pulse is discarded and the next pulse is taken as the first pulse (step 505). Method 500 then repeats at step 502 where pulses of the input signal are received.

If the time duration between the first two signal edges is longer than the lower pulse limit $P_{LL}$, method 500 proceeds to determine if the time duration between the first and second signal edges is less than the upper pulse limit $P_{UL}$ (step 506). If the time duration between the first two signal edges are longer than the upper pulse limit $P_{UL}$, then method 500 generates an internal reset (step 507) and repeats at step 502 where pulses of the input signal are received. The internal reset signal resets the noise discrimination method to an initial state with the Valid signal deasserted.

If the time duration between the first two signal edges is shorter than the upper pulse limit $P_{UL}$, method 500 proceeds to determine if the time duration between the second and third signal edges is greater than the lower pulse limit $P_{LL}$ (step 508). If the time duration between the second and third signal edges are shorter than the lower pulse limit $P_{LL}$, then the second pulse is discarded and the next pulse is taken as the first pulse (step 509). Method 500 then repeats at step 502 where pulses of the input signal are received.

If the time duration between the second and third signal edges are longer than the lower pulse limit $P_{LL}$, method 500 proceeds to determine if the time duration between the second and third signal edges is less than the upper pulse limit $P_{UL}$ (step 510). If the time duration between the second and third signal edges are longer than the upper pulse limit $P_{UL}$, then method 500 generates an internal reset (step 511) and repeats at step 502 where pulses of the input signal are received. If the time duration between the second and third signal edges are shorter than the upper pulse limit $P_{UL}$, then all conditions for a valid burst signal preamble are met and method 500 asserts the Valid signal (step 512).

Figure 10:
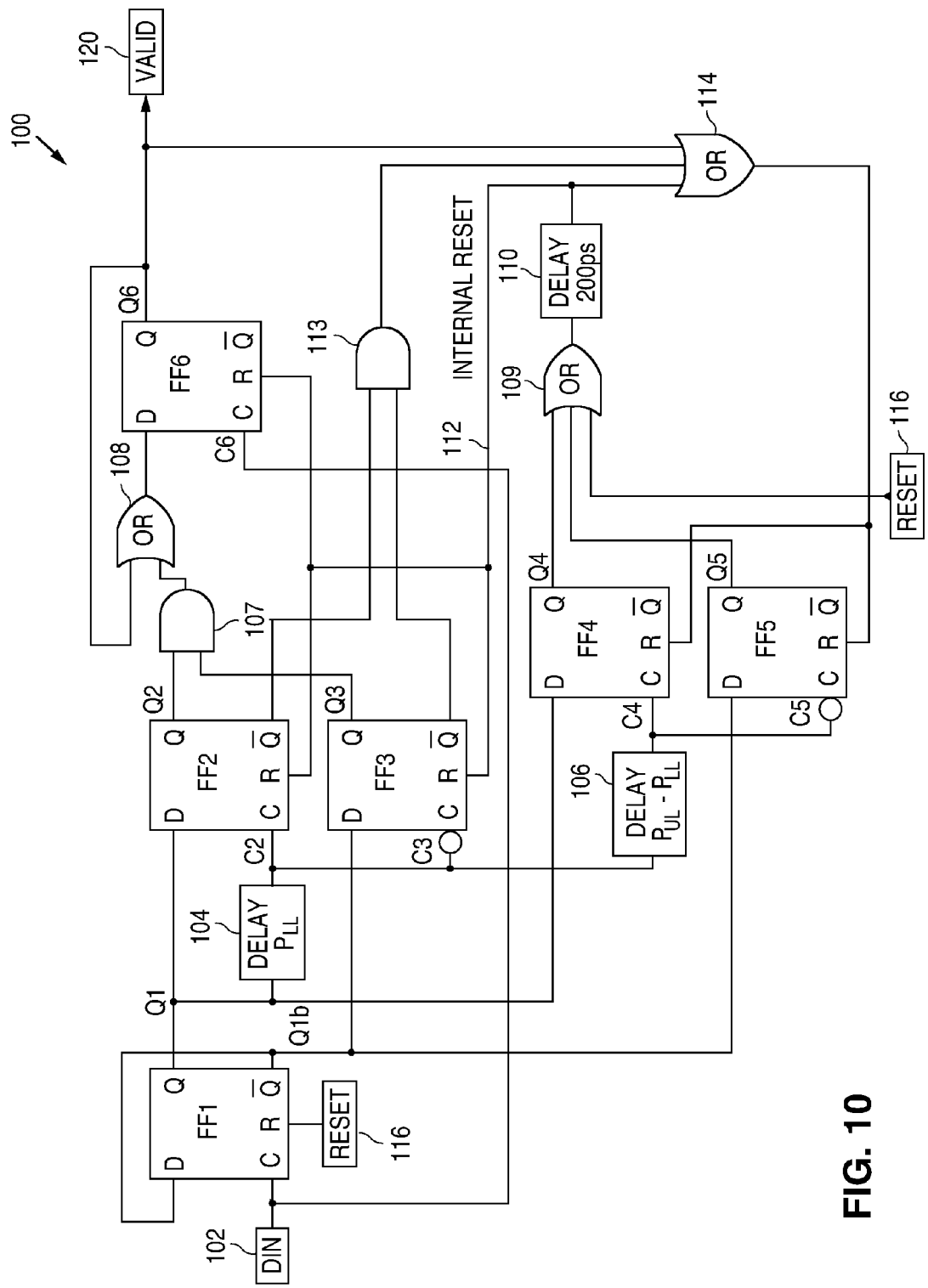
FIG. 10 is a logic schematic diagram of a noise discriminator circuit which can be incorporated in an OLT burst mode receiver of a PON according to one embodiment of the present invention.

FIG. 10 is a logic schematic diagram of a noise discriminator circuit which can be incorporated in a OLT burst mode receiver of a PON according to one embodiment of the present invention. Referring to FIG. 10, a noise discriminator circuit 100 is constructed using flip-flops FF1 to FF6, combinational logic gates 107-109, 113, 114 and delay circuits 104, 106 and 110. The incoming data signal DIN from the limiting amplifier is received as the clock input (node 102) to the first flip-flop FF1. The Valid signal is the Q output (node 120) of the last flip-flop FF6. The noise discriminator circuit 100 also receives an external Reset signal (node 116) to force reset of the circuit elements. The noise discriminator circuit 100 further generates an internal reset signal (node 112) based on the external Reset signal, the Q output of flip-flop FF4 or the Q output of flip-flop FF5 and after a given delay provided by delay circuit 110. The delay circuit 104 establishes the lower pulse limit $P_{LL}$ while the delay circuit 106 establishes the difference between the upper pulse limit $P_{UL}$ and the lower pulse limit $P_{LL}$. The two delay circuits operate in conjunction to set the time range for comparison of the rising edges of two consecutive pulses.

Figure 11A:
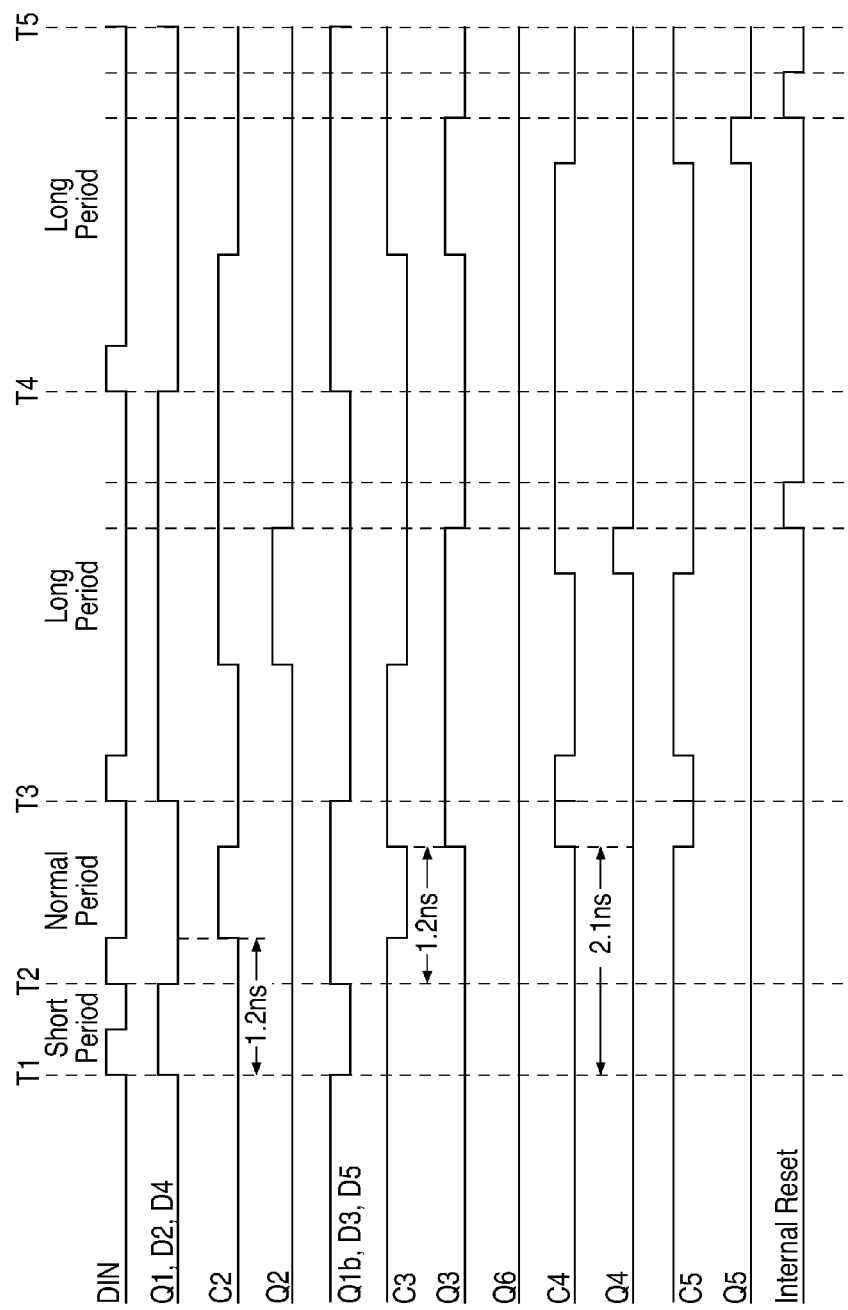
FIGS. 11A and 11B, is a timing diagram illustrating the operation of the noise discriminator circuit of FIG. 10 according to one embodiment of the present invention.
Figure 11B:
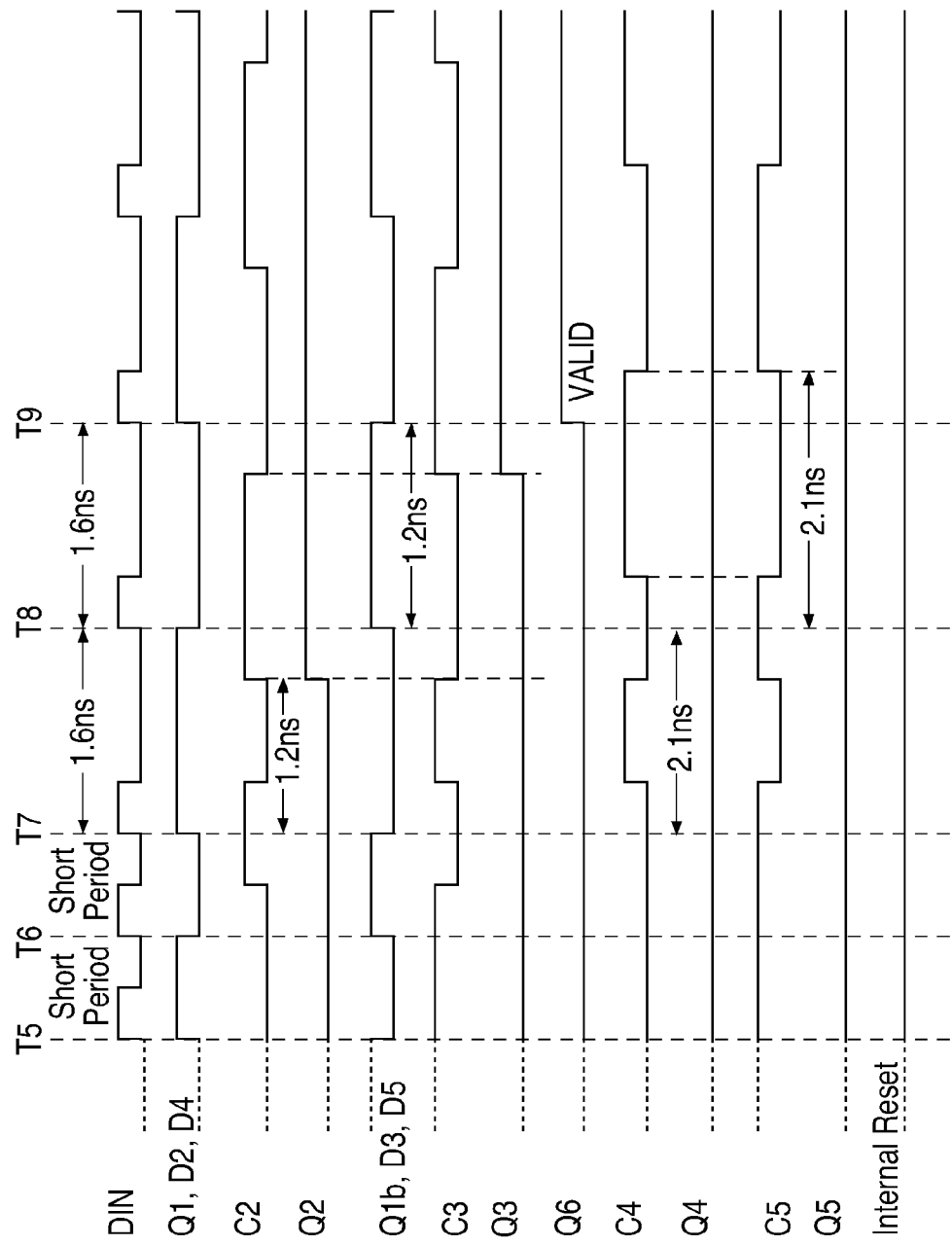

FIG. 11, which includes FIGS. 11A and 11B, is a timing diagram illustrating the operation of the noise discriminator circuit of FIG. 10 according to one embodiment of the present invention. The waveforms in FIG. 11 illustrates the operation of the noise discriminator circuit for a PON running at 1.25 Gbps data rate where the time period between rising edges of pulses should be about 1.6 ns. The waveforms in FIG. 11 further illustrate a lower pulse limit $P_{LL}$ of 1.2 ns and an upper pulse limit $P_{UL}$ of 2.1 ns. Referring to FIG. 11, at times T1 and T2, two pulses of the incoming data signal DIN are received. However, the duration between the two pulses is less than the PLL of 1.2 ns. Therefore, the first pulse is discarded and the noise discriminator circuit operates on the next two pulses (time T2 and T3). The next two pulses at time T2 and T3 have a normal period between in the range of 1.2 ns and 2.1 ns. However, the next pulse T4 following these two pulses has a long separation from the pulse at T3, much longer than the 2.1 ns upper pulse limit. The internal Reset is asserted when the pulse at T4 did not arrive after the delay determined by the delay circuit 100 in FIG. 10. In one embodiment, the delay of circuit 110 is 200 ps.

The noise discriminator circuit continues to operate until three consecutive pulses having timing separations that are within the given time range are received. In the present illustration, the pulses at times T7, T8 and T9 have periods that are within the given time range of 1.2 ns and 2.1 ns. Thus, at the third rising edge (time T9), the Valid signal (Q6) is asserted to indicate detection of a valid burst signal.

Figure 12A:
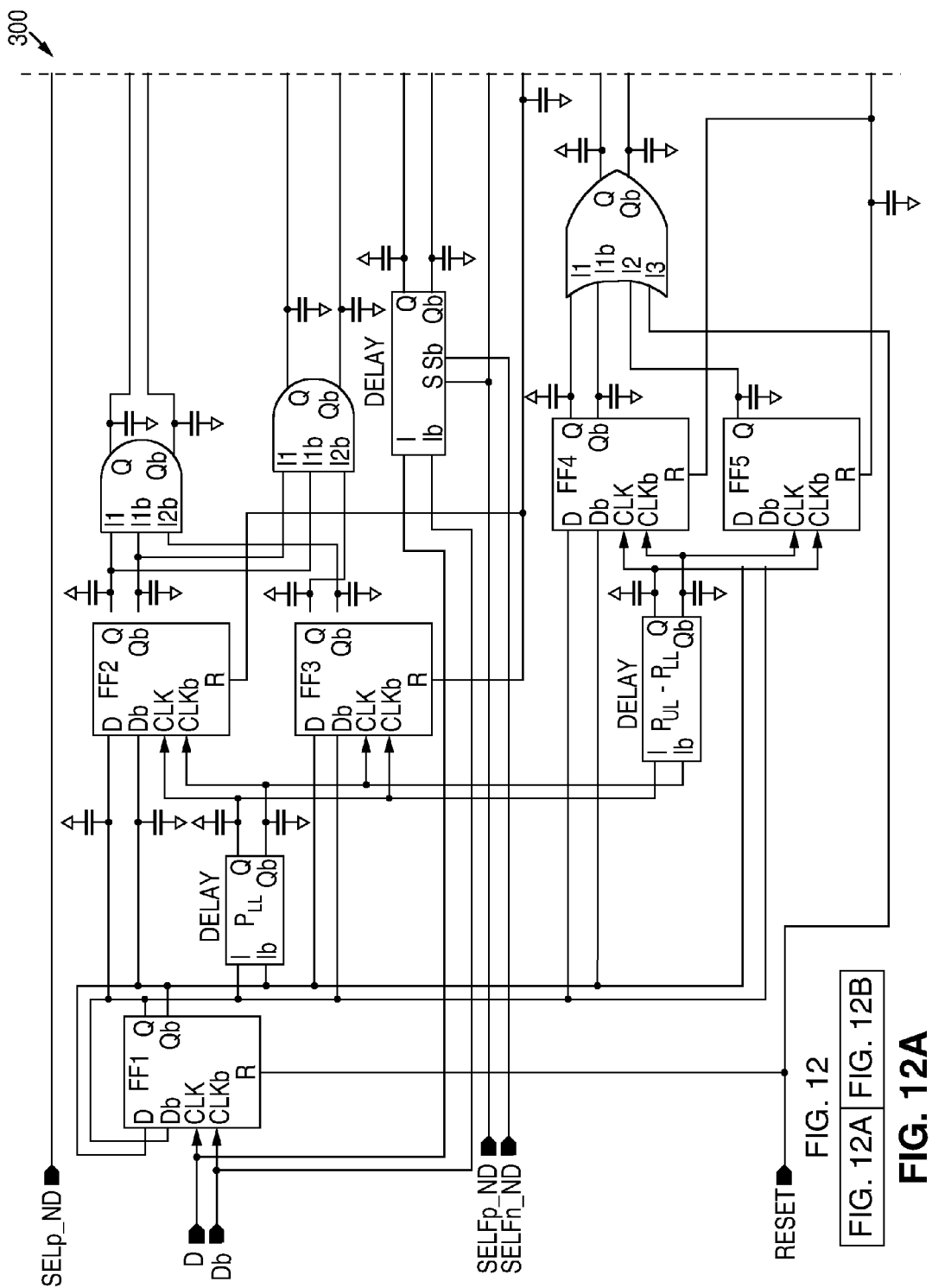
FIGS. 12A and 12B, is a logic schematic diagram of a noise discriminator circuit using differential drive which can be incorporated in an OLT burst mode receiver according to an alternate embodiment of the present invention.
Figure 12B:
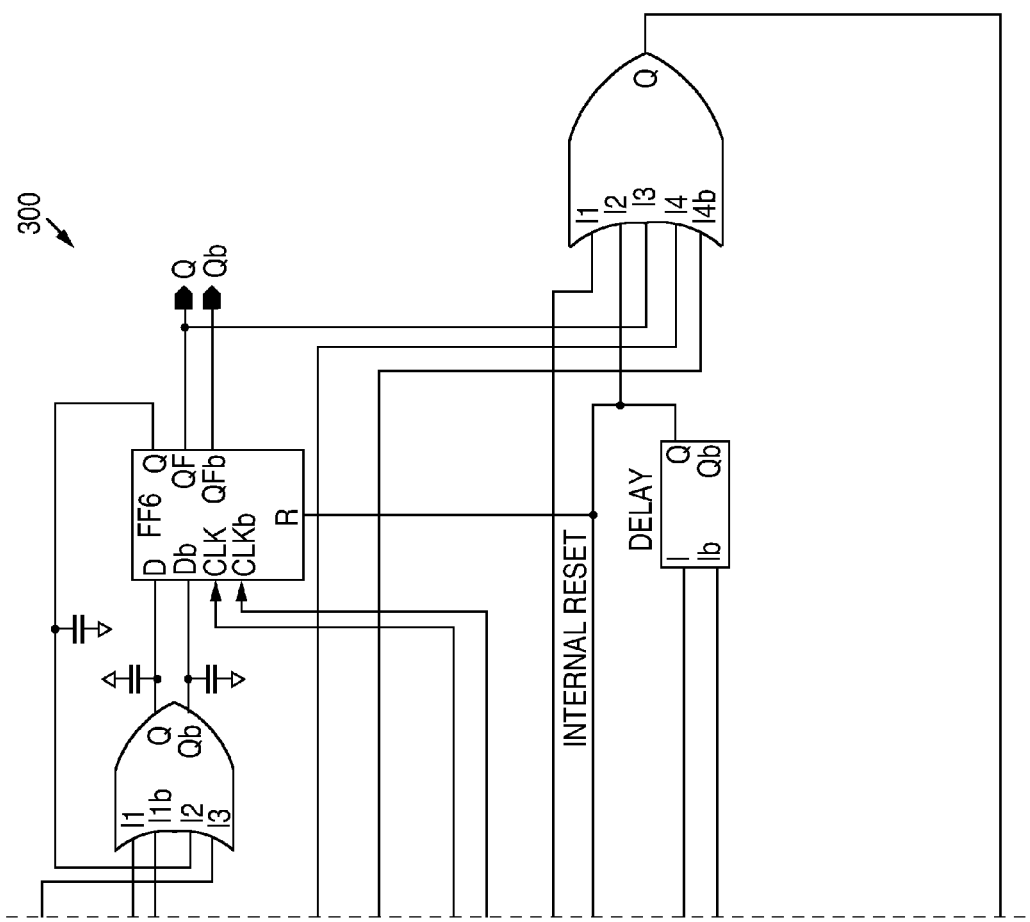

FIG. 12, which includes FIGS. 12A and 12B, is a schematic diagram of a noise discriminator circuit which can be incorporated in an OLT burst mode receiver according to an alternate embodiment of the present invention. FIG. 12 illustrates a differential implementation of the noise discriminator circuit of FIG. 10.

According to another aspect of the present invention, the burst mode receiver includes an amplifier with a tuned LC tank circuit to only pass preamble bits within the bandpass of the tuned circuit. For example, 622 MHz for 1.25 Gbps data rate PON; 1.2 GHz for 2.5 Gbps data rate PON; and 5 GHz for 10 Gbps data rate PON. Once the signal is detected, the band pass filter would be disengaged and the normal data stream could be turned on and passed uninhibited.

The above detailed descriptions are provided to illustrate specific embodiments of the present invention and are not intended to be limiting. Numerous modifications and variations within the scope of the present invention are possible. For instance, in FIG. 3, the limiting amplifier incorporates both a signal level detector and a noise discriminator to determine the validity of the input signal. In other embodiments, it is possible to provide a limiting amplifier with only the noise discriminator circuit whereby only the signal timing of the input signal is used to determine the validity of the input signal. The present invention is defined by the appended claims.

We claim:

1. A method in a burst mode receiver to determine the validity of an incoming burst signal, comprising:
   receiving consecutive pulses of an incoming signal;
   determining if a first time duration between a signal edge of a first pulse and a signal edge of a second pulse is within a first time range of a predetermined timing separation of a valid burst signal, the first pulse and the second pulse being consecutive pulses;
   if the first time duration is within the first time range, determining if a second time duration between the signal edge of the second pulse and a signal edge of a third pulse is within the first time range, the second pulse and the third pulse being consecutive pulses;
   if the second time duration is within the first time range, asserting a signal indicative of a valid burst signal; and
   if the first time duration is not within the first time range or the second time duration is not within the first time range, deasserting the signal indicative of a valid burst signal.

2. The method of claim 1, wherein asserting a signal indicative of a valid burst signal comprises asserting a signal detect signal.

3. The method of claim 2, wherein asserting a signal detect signal comprises asserting the signal detect signal on the signal edge of the third pulse when the signal indicative of a valid burst signal is asserted.

4. The method of claim 1, wherein after deasserting the signal indicative of a valid burst signal, the method further comprises discarding at least the first and second pulses and returning to receiving the next three consecutive pulses.

5. The method of claim 1, wherein the predetermined timing separation of a valid burst signal comprises the predetermined timing separation of the signal edges in the preamble data bits of the burst signal.

6. The method of claim 5, wherein the first time range comprises a time range around twice the period of the data rate of the incoming burst signal.

7. The method of claim 1, further comprises:
   when the first time duration is shorter than the first time range, discarding the first pulse and returning to receive the next consecutive pulses, the second pulse being used as the first pulse.

8. The method of claim 1, further comprises:
   when the first time duration is longer than the first time range, discarding the first and second pulses, asserting a reset signal and returning to receive the next consecutive pulses.

9. The method of claim 1, further comprises:
   when the second time duration is shorter than the first time range, discarding the second pulse and returning to receive the next consecutive pulses, the third pulse being used as the first pulse.

10. The method of claim 1, further comprises:
    when the second time duration is longer than the first time range, discarding the first, second and third pulses, asserting a reset signal and returning to receive the next consecutive pulses.

11. The method of claim 1, wherein the signal edges comprise rising edges, falling edges, or a combination of rising and falling edges.

12. A limiting amplifier for a burst mode receiver, comprising:
    an amplifier configured to receive and amplify an input signal representative of an incoming burst signal;
    a buffer configured to receive the amplified input signal and to generate an output signal;
    a noise discriminator circuit configured to receive the amplified input signal and to assert a valid output signal when a first time duration between a signal edge of a first pulse and a signal edge of a second pulse is within a first time range of a predetermined timing separation of a valid burst signal, the first pulse and the second pulse being consecutive pulses, and when a second time duration between the signal edge of the second pulse and a signal edge of a third pulse is within the first time range, the second pulse and the third pulse being consecutive pulses; and a signal detect generator circuit configured to assert a signal detect signal when the valid output signal is asserted.

13. The limiting amplifier of claim 12, further comprising:
a signal level detector circuit configured to receive the amplified input signal and to generate a detected data signal when the amplified input signal has a signal amplitude greater than a signal threshold,
wherein the signal detect generator circuit is configured to assert the signal detect signal when both the detected data signal is asserted and the valid output signal is asserted.

14. The limiting amplifier of claim 13, wherein the noise discriminator circuit is configured to receive either the amplified input signal or the detected data signal and to assert the valid output signal when both the first time duration and the second time duration are within the time range of a predetermined timing separation of a valid burst signal.

15. The limiting amplifier of claim 12, wherein the signal detect generator circuit is configured to deassert the signal detect signal when the first time duration or the second time duration is not within the first time range, the noise discriminator circuit further configured to discard at least the first and second pulses and return to receiving the next three consecutive pulses.

16. The limiting amplifier of claim 12, wherein when the first time duration is shorter than the first time range, the noise discriminator circuit is configured to discard the first pulse and to receive the next consecutive pulses, the second pulse being used as the first pulse.

17. The limiting amplifier of claim 12, wherein when the first time duration is longer than the first time range, the noise discriminator circuit is configured to discard the first and second pulses and to assert a reset signal and return to receive the next consecutive pulses.

18. The limiting amplifier of claim 12, wherein when the second time duration is shorter than the first time range, the noise discriminator circuit is configured to discard the second pulse and return to receive the next consecutive pulses, the third pulse being used as the first pulse.

19. The limiting amplifier of claim 12, wherein when the second time duration is longer than the first time range, the noise discriminator circuit is configured to discard the first, second and third pulses, assert a reset signal and return to receive the next consecutive pulses.

20. The limiting amplifier of claim 12, wherein the predetermined timing separation of a valid burst signal comprises the predetermined timing separation of the signal edges in the preamble data bits of the burst signal.

21. The limiting amplifier of claim 20, wherein the predetermined timing separation of the signal edges in the preamble data bits of the burst signal comprises a timing separation being twice the period of the data rate of the burst signal.

22. The limiting amplifier of claim 12, wherein the signal edges of the pulses comprise rising edges, falling edges, or a combination of rising and falling edges.

* * * * *